US011456367B2

(12) United States Patent
Chi et al.

(10) Patent No.: US 11,456,367 B2
(45) Date of Patent: Sep. 27, 2022

(54) TRENCH GATE STRUCTURE AND METHOD OF FORMING A TRENCH GATE STRUCTURE

(71) Applicant: SiEn (QingDao) Integrated Circuits Co., Ltd., Shandong (CN)

(72) Inventors: Min-Hwa Chi, Qingdao (CN); Longkang Yang, Qingdao (CN); Huaihua Xu, Qingdao (CN); Huan Wang, Qingdao (CN); Richard Ru-Gin Chang, Qingdao (CN)

(73) Assignee: SiEn (QingDao) Integrated Circuits Co., Ltd., Qingdao (CN)

( * ) Notice: Subject to any disclaimer, the term of this patent is extended or adjusted under 35 U.S.C. 154(b) by 34 days.

(21) Appl. No.: 17/243,061

(22) Filed: Apr. 28, 2021

(65) Prior Publication Data

US 2021/0343850 A1 Nov. 4, 2021

(30) Foreign Application Priority Data

Apr. 29, 2020 (CN) .......................... 202010356464.1

(51) Int. Cl.
*H01L 29/423* (2006.01)
*H01L 29/40* (2006.01)
*H01L 29/66* (2006.01)
*H01L 29/739* (2006.01)
*H01L 29/78* (2006.01)
*H01L 29/04* (2006.01)

(52) U.S. Cl.
CPC ........ *H01L 29/42368* (2013.01); *H01L 29/04* (2013.01); *H01L 29/045* (2013.01); *H01L 29/401* (2013.01); *H01L 29/4236* (2013.01); *H01L 29/42376* (2013.01); *H01L 29/66348* (2013.01); *H01L 29/66734* (2013.01); *H01L 29/7397* (2013.01); *H01L 29/7813* (2013.01)

(58) Field of Classification Search
CPC . H01L 29/04; H01L 29/045; H01L 29/42368; H01L 29/4236; H01L 29/66348; H01L 29/66734; H01L 29/7397; H01L 29/7813
See application file for complete search history.

(56) References Cited

U.S. PATENT DOCUMENTS

2013/0075759 A1\* 3/2013 Wada ................ H01L 29/66068 257/77

FOREIGN PATENT DOCUMENTS

CN 102800700 A \* 11/2012
KR 101852342 B1 \* 4/2018

\* cited by examiner

*Primary Examiner* — Joseph C. Nicely
(74) *Attorney, Agent, or Firm* — Chen Yoshimura LLP

(57) ABSTRACT

The present invention provides a trench gate structure and a method of forming the same. The method comprises steps of forming a first trench on the surface of a substrate, a surface of a bottom of the first trench comprising a crystal face belonging to the first family of crystal faces, and a surface of a sidewall of the first trench comprising another crystal face belonging to a second family of crystal faces. With a face-selective wet etching, a specific crystal face is presented on the surface of the bottom of the trench and a thicker gate oxide layer is formed thereon after performing thermal oxidation to avoid from failure due to thinner gate oxide layer on the surface of the bottom, increase breakdown voltage, and improve reliability of the device.

16 Claims, 5 Drawing Sheets

TRENCH GATE STRUCTURE AND METHOD OF FORMING A TRENCH GATE STRUCTURE

FIELD OF THE INVENTION

The present invention generally relates to manufacturing of a semiconductor circuit. Specifically, the present invention relates to a trench gate structure and a method of forming a trench gate structure for semiconductor power devices.

BACKGROUND OF THE INVENTION

In a power device such as trench gate MOSFET and IGBT, the quality of a gate oxide in a trench has the important influence on characteristics of the device, such as breakdown voltage. The gate oxide layer generally is formed with a thermal oxidation process on a substrate. However, because various factors, for example, thermal oxidation process mechanism and different crystal faces of sidewall and bottom of the trench, the gate oxide layer on the bottom of the trench gate is always thinner than that on the sidewall of the trench. This will make breakdown at the bottom of the trench gate more easily. To prevent from breakdown to introduce a bottom gate oxide layer with enough thickness will make the gate oxide layer on the sidewall excessively thick to affect key performance of the device such as threshold voltage.

Currently, aiming on the thinner thickness of the bottom gate oxide layer, various means trying to add the thickness of the bottom gate oxide layer are developed. For example, to increase thermal oxidation growing rate at the bottom of the trench, ion implantation may be performed at the bottom of the trench, or the appearance of the bottom of the trench may be changed, or an additional oxidation growing step may be added after covering the sidewall of the trench, or introducing split gate structure wrapped by thick oxide at the bottom of the trench. However, aforesaid means accompany problems such as insufficient thickness of the bottom gate oxide, compared with the requirement in the specification of the device, structural defect or increasing cost for performing the additional complex processes.

Therefore, a novel trench gate structure and method of forming a trench gate structure is needed to solve the problems.

SUMMARY OF THE INVENTION

In light of aforesaid problems in the current technologies, an object of the present invention is to provide a trench gate structure and a method of forming a trench gate structure to solve the problem of thinner bottom gate oxide layer of a trench gate.

For the object and other related object(s), the present invention provides a trench gate structure and a method of forming a trench gate structure, characterized by, comprising steps of: providing a substrate, a crystal face of a surface of which belongs to a first family of crystal faces; forming a first trench on the surface of the substrate, a surface of a bottom of the first trench comprising a crystal face belonging to the first family of crystal faces, and a surface of a sidewall of the first trench comprising another crystal face belonging to a second family of crystal faces; forming an isolation layer on the surface of the sidewall of the first trench; performing face-selective wet etching on the surface of the bottom of the first trench and forming a second trench, a surface of the second trench comprising a crystal face belonging to a third family of crystal faces; a density of atom of the crystal face of the third family of crystal faces being higher than that of the crystal face of the first and second families of crystal faces; removing the isolation layer, and forming a thermal oxidation layer on the surface of the sidewall of the first trench and the surface of the second trench through a thermal oxidation process, a thickness of the thermal oxidation layer on the surface of the second trench is greater than that on the surface of the sidewall of the first trench.

An option of the present invention is that the substrate comprises silicon substrate, the first family of crystal faces comprises {100} family, the second family of crystal faces comprises {110} family, and the third family of crystal faces comprises {111} family.

An option of the present invention is that the wet etching is performed with solution of tetramethyl ammonium hydroxide (TMAH) or potassium hydroxide (KOH) as etchant.

An option of the present invention is that forming the first trench is performed with dry etching.

An option of the present invention is that the surface of the bottom of the first trench is a recessed surface or a flat surface.

An option of the present invention is that forming the isolation layer comprising steps of: depositing a layer of isolation material on the first trench and the surface of the substrate; performing anisotropic dry etching on the layer of isolation material to remove the layer of isolation material on the first trench and the surface of the substrate and forming the isolation layer on the surface of the sidewall of the first trench.

An option of the present invention is that the second trench is a V-shaped trench.

An option of the present invention is that the second trench has a plurality of surfaces, and rounded transition areas are formed between the surfaces and between the surfaces and the surface of the sidewall of the first trench after the thermal oxidation process.

The present invention also provides a trench gate structure, characterized by, comprising: a first trench and a second trench, formed on a substrate, the second trench being under the first trench; a thermal oxidation layer, formed on surfaces of the first trench and the second trench; a crystal face of a surface of the substrate belonging to a first family of crystal faces, a surface of a sidewall of the first trench comprising another crystal face of a second family of crystal faces, the surface of the second trench comprising yet another crystal face of a third family of crystal faces, a density of atom of the crystal face of the third family of crystal faces being higher than that of the first family of crystal faces and that of the second family of crystal faces, and a thickness of the thermal oxidation layer formed on the surface of the second trench being greater than that of the thermal oxidation layer formed on the surface of the sidewall of the first trench.

An option of the present invention is that the substrate comprises silicon substrate, the first family of crystal faces comprises {100} family, the second family of crystal faces comprises {110} family, and the third family of crystal faces comprises {111} family.

An option of the present invention is that the second trench is a V-shaped trench.

An option of the present invention is that the second trench has a plurality of surfaces, and rounded transition areas are formed between the surfaces.

The present invention also provides a power device, characterized by, comprising a trench gate structure according to the present invention.

As mentioned above, the present invention provides a trench gate structure and a method of forming a trench gate structure which is beneficial to: avoid from failure due to thinner bottom gate oxide layer, increase breakdown voltage, and improve consistency of threshold voltage and reliability of the device through introducing a novel trench gate structure and method of forming a trench gate structure which apply face-selective wet etching to present a specific crystal face on the surface of the bottom of the trench and form a thicker gate oxide layer thereon than the gate oxide layer on the sidewall.

REFERENCE SIGNS

Figure 1:
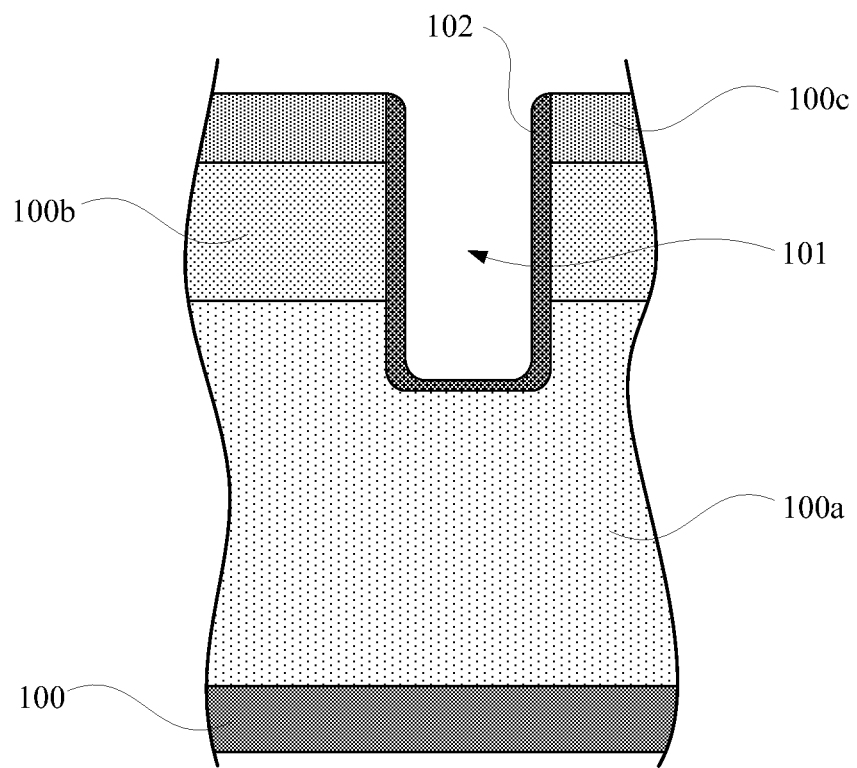
FIG. 1 shows a cross-sectional view of a trench gate after performing a thermal oxidation process.

100 N+ doped substrate
100a N− doped epitaxy layer
100b P− doped layer
100c N+ doped layer
101 trench
102 thermal oxidation layer
200 N+ doped substrate
200a N− doped epitaxy layer
200b P− doped layer
200c N+ doped layer
201 first trench
201a hard mask layer
202 isolation layer
202a layer of isolation material
203 second trench
204 thermal oxidation layer

DESCRIPTION OF EMBODIMENTS OF THE INVENTION

Reference is now made to the following concrete examples taken in conjunction with the accompanying drawings to illustrate implementation of the present invention. Persons of ordinary skill in the art having the benefit of the present disclosure will understand other advantages and effects of the present invention. The present invention may be implemented with other examples. For various view or application, details in the present disclosure may be used for variation or change for implementing embodiments within the scope of the present invention.

Please refer to FIGS. 1 to 9. Please note that the drawings provided here are only for example but not limited to the specific number or scale shown therein. When implementing the examples according to the drawings, condition, number and proportion of each element may be changed and arrangement of the elements may be in a more complex way.

First Embodiment

A cross-sectional view of a trench gate after performing a thermal oxidation process is shown in FIG. 1. In FIG. 1, on a N+ doped substrate 100, a N− doped epitaxy layer 100a, a P− doped layer 100b and a N+ doped layer 100c, formed with ion implantation or furnace diffusion are formed sequentially. Optionally, these layers are formed with silicon material doped differently. Through dry etching, a trench 101 is formed in the silicon substrate. Through thermal oxidation process, a thermal oxidation layer 102 is formed on sidewall and bottom of the trench 101 as a gate oxide layer. As shown in FIG. 1, a thickness of the thermal oxidation layer 102 on the sidewall of the trench 101 is greater than that on the bottom of the trench 101 because crystal face of the sidewall is different from that of the bottom. For example, the crystal face of the bottom is a (100) face of silicon, and the crystal face of the sidewall is a (110) face of silicon. Growing speed of thermal oxidation on the (110) face is faster than that on the (100) face and so as to make the thermal oxidation layer on the bottom of the trench thinner. This is the dominant reason for the trench having a greater critical dimension (CD), which is an opening width here. Another reason for the slower growing speed is that growth of the thermal oxidation on the bottom of the trench is limited by stress and diffusion of oxide atoms due to the position of the bottom. Aforesaid reason is dominant for the trench having a smaller CD. Power devices with thinner gate oxide layer on the bottom of the trench may make breakdown more easily at the bottom of the trench to affect the performance.

Please further note that only a simplified view of the trench 101 is shown in FIG. 1. In fact, after performing the dry etching, the appearance of the trench is usually U-shaped, i.e., the appearance of the bottom of the trench is recessed and curved. The curve of the bottom may be adjusted through changing parameter(s) used in the dry etching process and opening width of the trench. The sidewall may be adjusted through the dry etching process to present an angle relative to vertical direction.

Please refer to FIGS. 2 to 9. The present embodiment provides a trench gate structure and a method of forming a trench gate structure, characterized by, comprising steps of: 1) providing a substrate, a crystal face of a surface of which belongs to a first family of crystal faces; 2) forming a first trench on the surface of the substrate, a surface of a bottom of the first trench comprising a crystal face belonging to the first family of crystal faces, and a surface of a sidewall of the first trench comprising another crystal face belonging to a second family of crystal faces; 3) forming an isolation layer on the surface of the sidewall of the first trench; 4) performing face-selective wet etching on the surface of the bottom of the first trench and forming a second trench, a surface of the second trench comprising a crystal face belonging to a third family of crystal faces; a density of atom of the crystal face of the third family of crystal faces being higher than that of the crystal face of the first and second families of crystal faces; 5) removing the isolation layer, and forming a thermal oxidation layer on the surface of the sidewall of the first trench and the surface of the second trench through a thermal oxidation process, a thickness of the thermal oxidation layer on the surface of the second trench is greater than that on the surface of the sidewall of the first trench.

Figure 2:
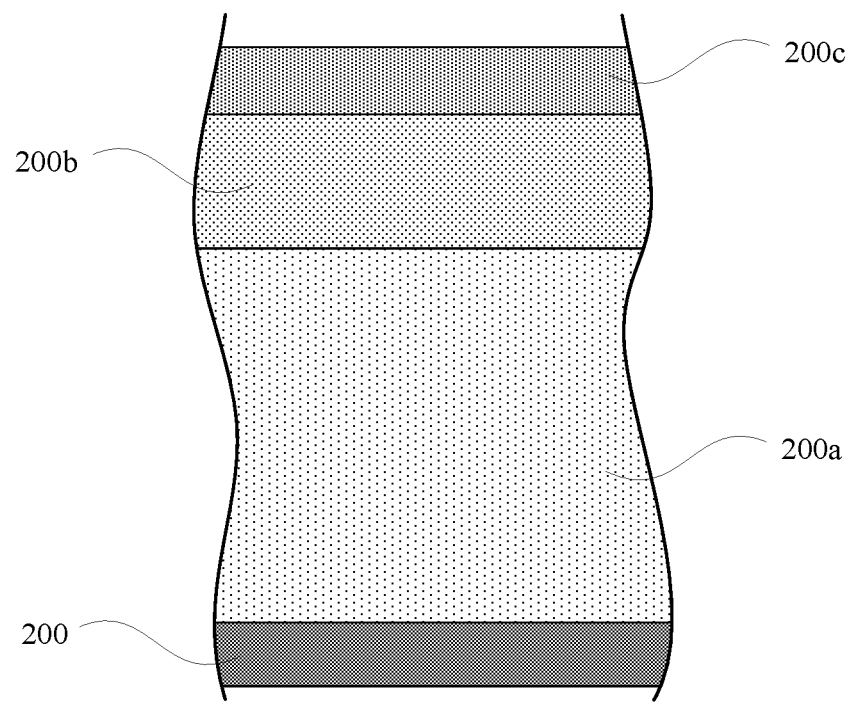
FIG. 2 illustrates a cross-sectional view of a substrate according to a first embodiment of the invention.

In the step 1), please refer to FIG. 2, in which a substrate is provided, and a crystal face of a surface of the substrate belongs to a first family of crystal faces. For example, as shown in FIG. 2, a N− doped epitaxy layer 200a, P− doped layer 200b and N+ doped layer 200c, formed sequentially with ion implantation or furnace diffusion on the N+ doped substrate 200 in the present embodiment. These layers are essential elements in a power device, and the substrate denoted in the present embodiment comprises these layers, but in other embodiments of the present invention, these layers may be adjusted to provide various devices. When the N+ doped substrate 200 is silicon substrate, and the crystal face of the surface is (100) face, a surface of the N− doped epitaxy layer 200a epitaxially growing on the surface of the N+ doped substrate 200 is also (100) face. Then, after forming the P− doped layer 200b and N+ doped layer 200c with ion implantation in order, a surface of the N+ doped layer 200c is (100) face. Optionally, these layers may be made with silicon material and other semiconductor materials, such as germanium, silicon-germanium, or silicon carbide.

Figure 3:
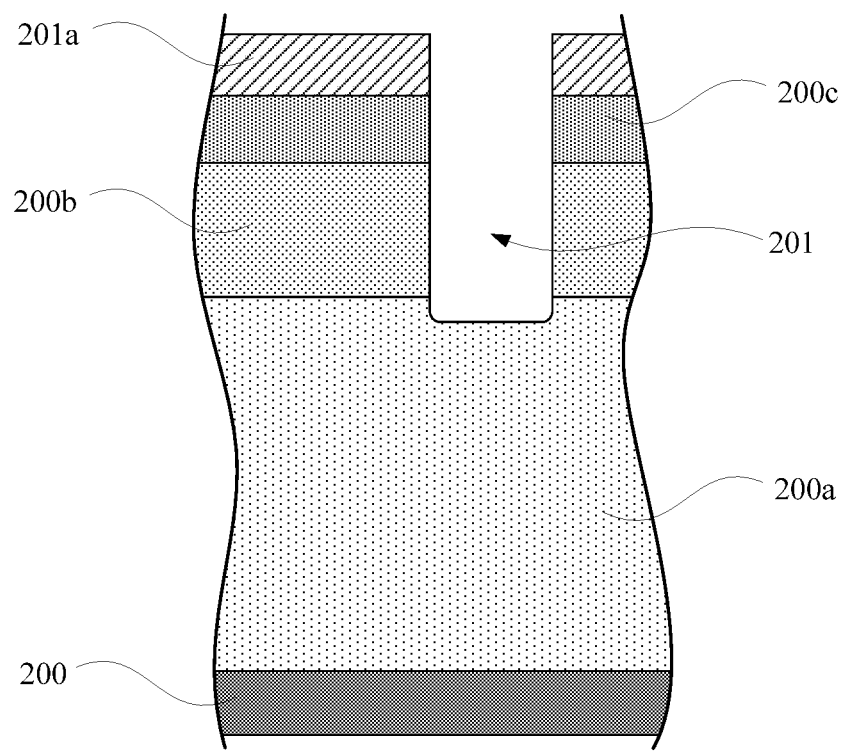
FIG. 3 illustrates a cross-sectional view after forming a first trench according to the first embodiment of the invention.

In the step 2), please refer to FIGS. 2 and 3. A first trench 201 is formed at the surface of the substrate. A surface of a bottom of the first trench 201 comprises a crystal face which belongs to a first family of the crystal faces, and a surface of a sidewall of the first trench 201 comprises a crystal face which belongs to a second family of the crystal faces. Optionally, with respect to silicon substrate, in its cubic crystal structure, the first family of the crystal faces comprises {100} family, and the second family of the crystal faces comprises {110} family. The first family of the crystal faces, {100} family, comprises (100), (010) and (001) faces, and similarly, the second family of the crystal faces, {110} family, comprises (110), (011) and (101) faces. The crystal face of the surface of the bottom of the first trench 201 is the face belonging to one of the two families and that of the sidewall is the face belonging to another family.

For example, as shown in FIG. 3, a first trench 201 is formed at the surface of the substrate through dry etching. With respect to silicon substrate, etching gas may be chosen from $SF_6$ and HBr. The bottom of the first trench 201 formed with dry etching may be recessed surface or flat surface. The appearance of a U-shaped trench at the bottom of the trench generally is curved, and the curve may be adjusted by changing parameters used in the etching process and opening width of the trench. Optionally, a hard mask layer 201a may be used as etching mask in the dry etching process for the first trench 201. The hard mask layer 201a may be chosen from silicon dioxide material and may be patterned with lithography and etching processes.

Figure 4:
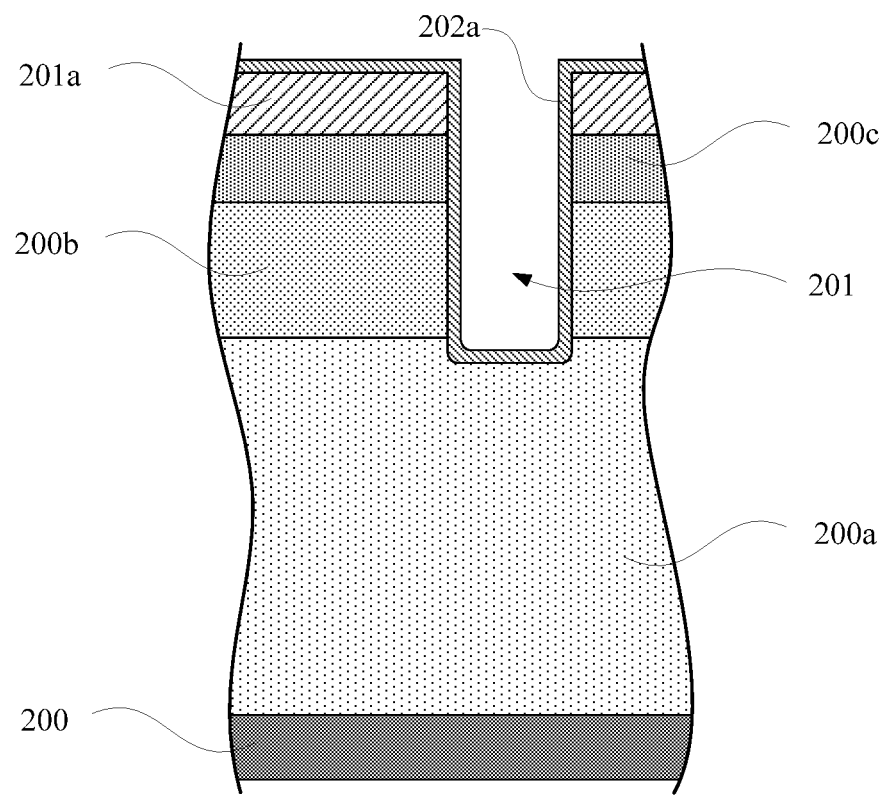
FIG. 4 illustrates a cross-sectional view after depositing an isolation material according to the first embodiment of the invention.
Figure 5:
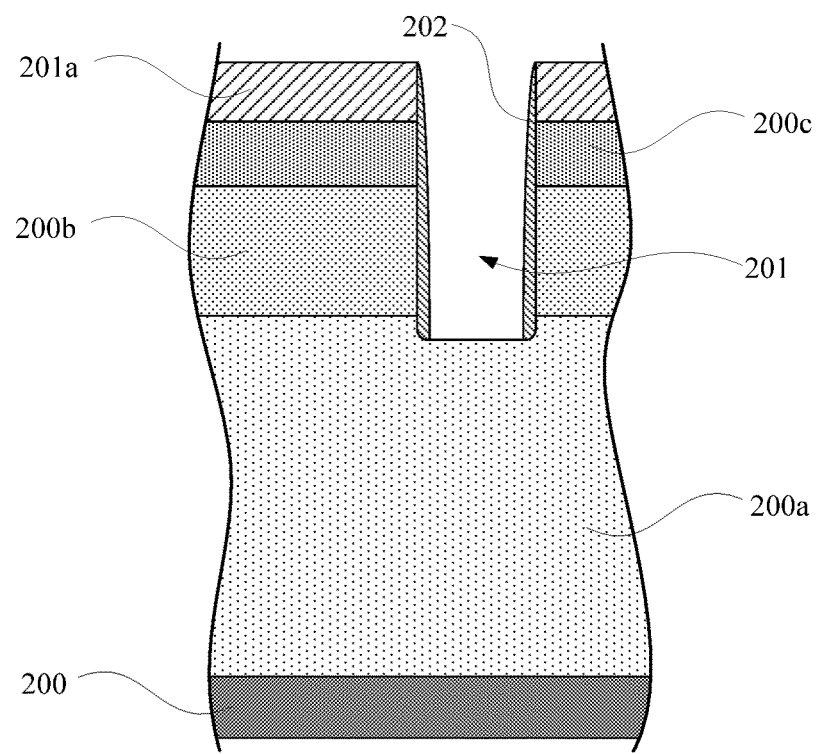
FIG. 5 illustrates a cross-sectional view after forming an isolation layer according to the first embodiment of the invention.

In the step 3), please refer to FIGS. 4 and 5. An isolation layer 202 is formed on the sidewall of the first trench 201.

For example, as shown in FIGS. 4 and 5, the isolation layer 202 may be formed with steps of: depositing a layer of isolation material 202a on the first trench 201 and the surface of the substrate; performing anisotropic dry etching on the layer of isolation material 202a to remove the layer of isolation material 202a on the first trench 201 and the surface of the substrate and forming the isolation layer 202 on the surface of the sidewall of the first trench 201.

As shown in FIG. 4, thin film technology such as chemical vapor deposition (CVD) or atomic layer deposition (ALD) may be used to deposit the layer of isolation material 202a on the first trench 201 and the surface of the substrate. The layer of isolation material 202a may be constructed by silicon dioxide or silicon nitride.

As shown in FIG. 5, anisotropic dry etching may be performed to remove the layer of isolation material 202a on the first trench 201 and the surface of the substrate and form the isolation layer 202 on the surface of the sidewall of the first trench 201. Optionally, the etching gas of the dry etching process etching silicon dioxide or silicon nitride may be chosen from CF family, such as $CF_4$ or $CHF_3$. The anisotropic property in the dry etching process may be ensured to keep the silicon dioxide or silicon nitride on the sidewall of the first trench 201 and present high selectivity with respect to the silicon substrate.

Figure 6:
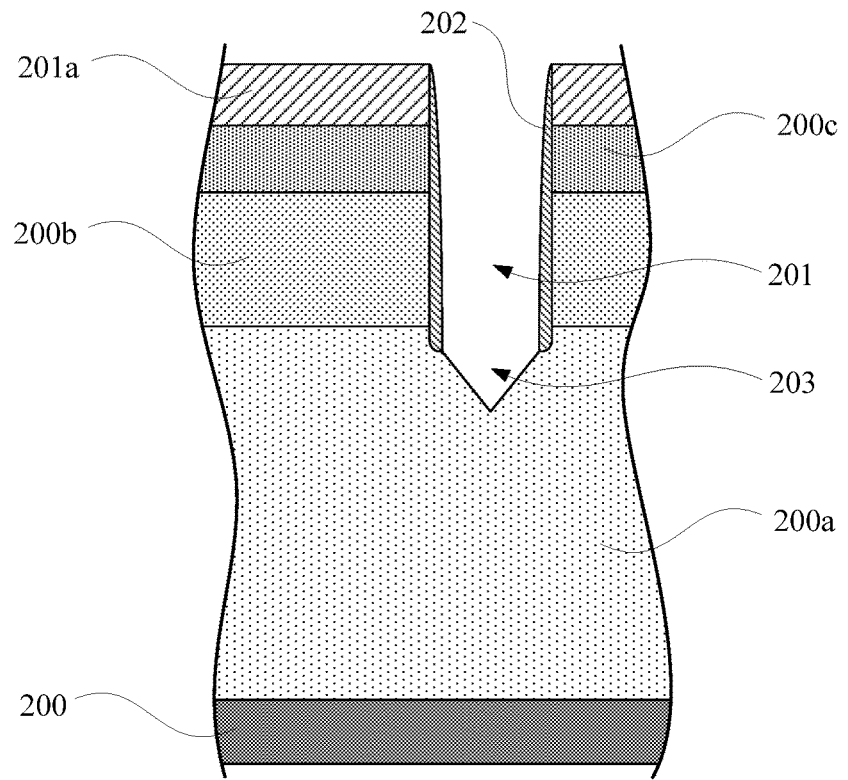
FIG. 6 illustrates a cross-sectional view after forming a second trench according to the first embodiment of the invention.
Figure 7:
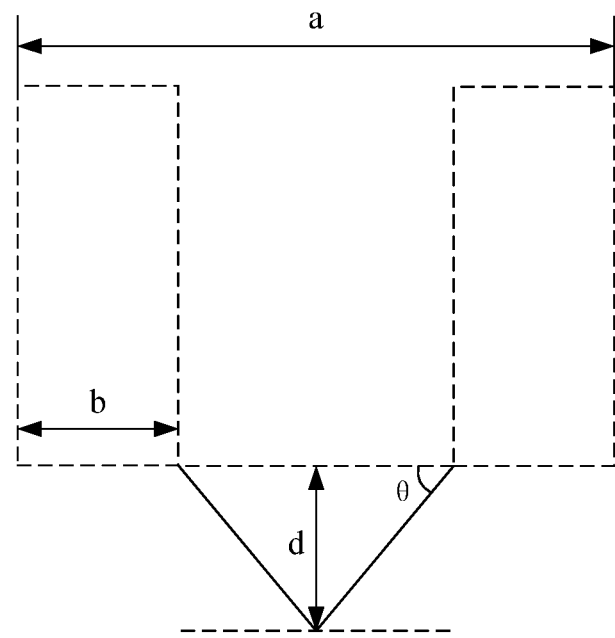
FIG. 7 illustrates a perspective view of opening widths of the first and second trenches according to the first embodiment of the invention.

In the step 4), please refer to FIGS. 6 and 7. Face-selective wet etching is performed on the surface of the bottom of the first trench 201 and a second trench 203 is formed. A surface of the second trench 203 comprises a crystal face belonging to a third family of crystal faces. A density of atom of the crystal face of the third family of crystal faces being higher than that of the crystal face of the first and second families of crystal faces.

For example, with respect to the silicon substrate of the present embodiment, the wet etching may be performed with solution of tetramethyl ammonium hydroxide (TMAH) or potassium hydroxide (KOH) as etchant. TMAH wet etching has face-selectivity for the (100) face of the silicon substrate. The wet etching may be automatically stopped at the crystal face of the third family of the crystal faces, {111} family, such as the (111) face, so as to protect the sidewall of the first trench 201, covered by the isolation layer 202. Other than TMAH, the etchant may be chosen from other etchant having face-selectivity, such as KOH solution. When these etchants having face-selectivity etch the crystal face of the first family of the crystal faces, such as the (100) face, the etching rate may be 10-100 times higher than that of the crystal face of the third family of the crystal faces, {111} family, such as the (111) face. The face-selectivity is high enough to automatically stop at the crystal face of the third family of the crystal faces, {111} family, such as the (111) face of silicon.

For example, as shown in FIG. 6, the second trench 203 is a V-shaped trench. The opening of the V-shaped trench basically is consistent to the bottom width of the first trench 201. The crystal face of the bottom of the first trench 201 belongs to the family of crystal faces {100}, such as the (100) face. After the wet etching stops at the crystal face of the third family of the crystal faces, {111} family, the appearance of the second trench 203 formed with the wet etching is V shape, and the crystal face of the both sidewalls of the V-shaped trench belong to the third family of the crystal faces, {111} family. For example, when the crystal face of one of the sidewalls of the V-shaped trench is the (111) face, the crystal face of the other one of the sidewalls of the V-shaped trench is the (1-1-1) face, an angle between the two crystal faces is about 70.5°, and an angle between either one of the two crystal faces and the (100) face is about 54.7°. At this time, the crystal face of the sidewall of the first trench 201 may be the (011) face of the second family of the crystal faces, {110} family, and an angle between the (011) face and either one of the (111) and (1-1-1) faces is about 144.7°.

For example, a perspective view during the wet etching is shown in FIG. 7. In FIG. 7, the V-shaped trench is formed with the wet etching process and the depth d of the V-shaped trench is the depth of the second trench 203. Width a represents an opening width of the first trench 201, and width b is a thickness of the isolation layer 202. As shown in FIG. 7, when the etching stops at the (111) face due to the face-selectivity of the wet etching of TMAH/KOH, a step structure with a width b may be formed at both sides of the V-shaped trench in light of the thickness of the isolation layer 202. Because an angle $\theta$ between the sidewall of the V-shaped trench and the surface of the bottom of the trench is determined, i.e. the angle $\theta$ between the (100) face and the (111) face is about 54.7°, the depth d may be calculated from $d=(a/2-b)\cdot\tan\theta$.

Please note that thinner thickness may be sufficient when the isolation layer 202 is formed with silicon dioxide. It is because the selectivity of silicon dioxide in the wet etching is higher. For example, with respect to the first trench 201 the width of which is about 1 um (i.e. 1000 nm or 10000 Å), the thickness of the isolation layer 202 generally may be less than 10 nm, and in the present embodiment, it is 5 nm (i.e. 50 Å), which implies the width a may be omitted, compared with the width b. Then, the depth d may be approximated as: $d=(a/2)\cdot\tan\theta$. When $\theta=54.7°$, d equals to about 0.706a. Therefore, the depth d of the second trench 203 is determined when the width a of the first trench 201 is determined.

Figure 8:
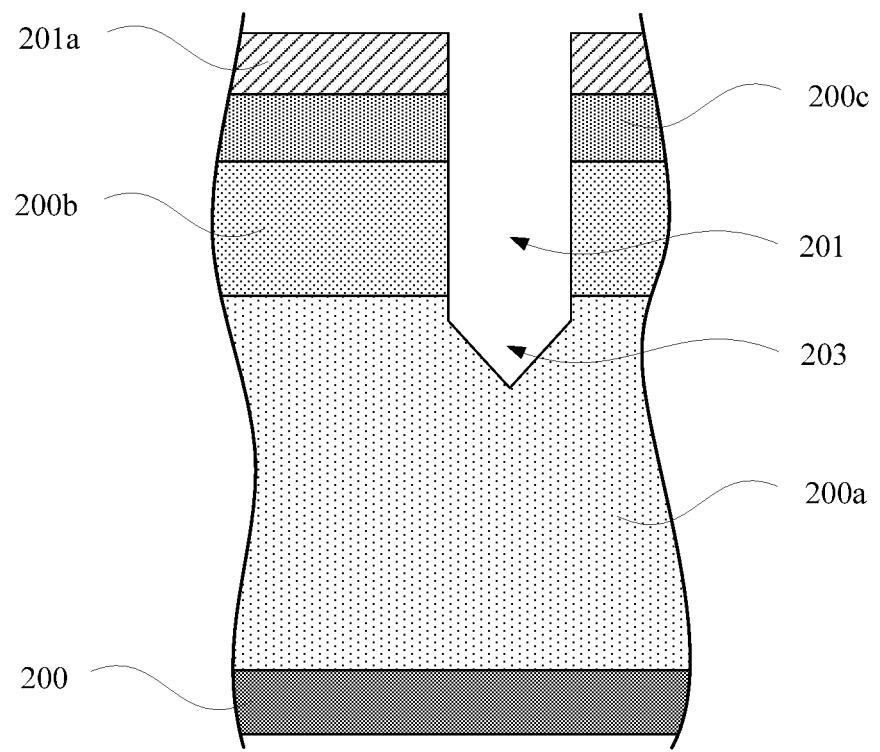
FIG. 8 illustrates a cross-sectional view after removing the isolation layer according to the first embodiment of the invention.
Figure 9:
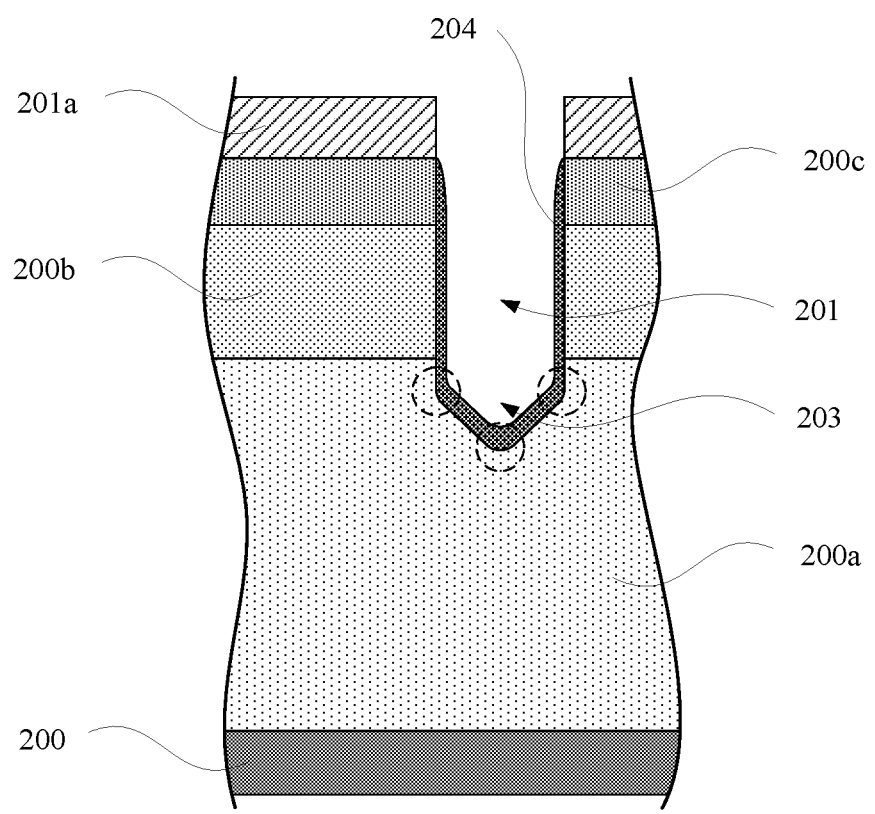
FIG. 9 illustrates a cross-sectional view after performing a thermal oxidation process according to the first embodiment of the invention.

In the step 5), please refer to FIGS. 8 and 9. The isolation layer 202 is removed. Through a thermal oxidation process, a thermal oxidation layer 204 is formed on the surface of the sidewall of the first trench 201 and a surface of the second trench 203. The thermal oxidation layer 204 on the surface of the second trench 203 is thicker than that on the surface of the sidewall of the first trench 201.

For example, in the present embodiment, because the surface interface of the first trench 201 belongs to the second family of the crystal faces, {110} family. The surface of the second trench 203 belongs to the third family of the crystal faces, {111} family, which leads to greater atomic density and greater spacing between adjacent atomic layers in the third family of the crystal faces, {111} family. The silicon dioxide actually formed on {111} will be thicker than that on the surface of {110}, under the same thermal oxidation conditions. For example, at a certain condition of the thermal oxidation, the thermal oxidation layer 204 on the surface of the second trench 203 may be 20% thicker than that on the surface of the sidewall of the first trench 201.

For example, the way to remove the isolation layer 202 may comprise wet etching. When the isolation layer 202 is silicon nitride, it may be removed with phosphoric acid ($H_3PO_4$) solution. When the isolation layer 202 is silicon dioxide, it may be removed with hydrofluoric acid (HF) solution. Please note that when the hard mask layer 201a is silicon dioxide, the hard mask layer 201a may be removed at the same time during removing the isolation layer 202, but this will not affect the follow-up process in the present embodiment. FIGS. 8 and 9 show that the hard mask layer 201a is silicon dioxide layer, and the isolation layer 202 is silicon nitride. The hard mask layer 201a is able to protect the surface of the silicon substrate during the wet etching of TMAH or KOH, and it can be removed after the wet etching of TMAH or KOH in any stop, depending on requirement in the actual process.

For example, as shown in FIG. 9, the second trench 203 has a plurality of surfaces. After the thermal oxidation process, rounded transition areas are formed between the surfaces and between the surfaces and the surface of the sidewall of the first trench 201. In the present embodiment, the second trench 203 is V-shaped trench, the crystal faces of both of the opposite sidewalls belong to the third family of the crystal faces, {111} family, and an angle therebetween is formed at the top. Besides, an angle between the both sidewalls of the second trench 203 and the sidewall of the first trench 201 is presented. In a power device, such as MOSFET or IGBT, if a sharp angle structure is formed in the trench gate, breakdown may occur easily in this position. Therefore, device performance may be affected. For this issue, although angles are formed between the surfaces after the wet etching in the trench, the rounded transition areas are formed between the surfaces after the thermal oxidation process in the present embodiment. This is because the growth of the silicon dioxide layer formed with thermal oxidation is in different growing speed, depending on different positions and diffusion conditions, in the thermal oxidation process, and eventually, the rounded transition areas are formed at the interfaces of different surfaces. As shown in FIG. 9, the positions marked by boxes of dotted line are the rounded transition areas. They will be beneficial to prevent from failure due to breakdown at one of the sharp angles.

Please note that the present embodiment provides the trench gate structure on the silicon wafer which is diamond cubic crystal structure. Therefore, compared with the {100}, {110} families, the atomic density of the {111} family is higher. In other embodiment of the present invention, the first, second and third families of crystal faces may be adjusted corresponding to the substrate which may be other crystal structure to form thicker thermal oxidation layer on the crystal face of the third family of crystal faces than that on the other crystal faces. According to the variation of the crystal face of different crystal structure, the appearance of the second trench may be another shape which is different from the V shape trench of the present embodiment to expose the crystal face of the third family of the crystal faces. Besides, for clearly showing the variation of thickness of the thermal oxidation layer in different positions and the appearance of the rounded transition areas, the drawings in the present embodiment exaggerate the thickness. As mentioned above, the actual thickness of the thermal oxidation layer is thinner than the width of the trench.

For example, after the thermal oxidation layer 204 is formed with the thermal oxidation process, an additional step of filling gate material, such as polysilicon into the trench may be performed. Optionally, the trench gate structure may comprise a split gate structure which introduces separation medium layer in the trench to construct the split gate structure with the gate material under the separation medium layer.

For example, after the trench gate structure is formed, for a power device such as MOSFET or IGBT, more steps for forming structures such as source and drain areas, a metal wiring layer and a passivation layer to complete the whole power device may be performed. Besides, for an IGBT device, more steps for polishing backside surface of a wafer, ion implantation, laser annealing and metallization may be performed. These steps may be performed with ordinary means and no necessary details are given here.

The thick oxidation layer formed on the bottom of the trench gate, provided in the present embodiment, is beneficial to raise breakdown voltage of the power device at this position and decrease Miller capacitance between the gate and the collector electrode. As such, the uniformity of the threshold voltage of the device may be improved even though a thinner gate oxide layer is used on the sidewall area of the trench gate. Therefore, lower threshold voltage and on resistance may be presented. Of course, using the thinner gate oxide layer on the sidewall is under the premise that such thickness is able to ensure the breakdown voltage of the device meet the specification. Besides, compared with current technology that adds thickness of the bottom gate oxide layer, the trench gate structure of the present embodiment can be manufactured efficiently without increasing cost. Therefore, the trench gate structure of the present embodiment has product competitiveness.

Second Embodiment

Please refer to FIG. 9. The present embodiment provides a trench gate structure, characterized by, comprising: a first trench 201 and a second trench 203 both of which are formed on a substrate; a thermal oxidation layer 204 formed on surfaces of the first trench 201 and the second trench 203; a crystal face of a surface of the substrate belonging to a first family of crystal faces, a surface of a sidewall of the first trench 201 comprising another crystal face of a second family of crystal faces, the surface of the second trench 203 comprising yet another crystal face of a third family of crystal faces, a density of atom of the crystal face of the third family of crystal faces being higher than that of the first family of crystal faces and that of the second family of crystal faces, and a thickness of the thermal oxidation layer 204 formed on the surface of the second trench 203 being greater than that of the thermal oxidation layer 204 formed on the surface of the sidewall of the first trench 201.

For example, the substrate comprises silicon substrate, the first family of crystal faces comprises {100} family, the second family of crystal faces comprises {110} family, and the third family of crystal faces comprises {111} family. The second trench is a V-shaped trench, the second trench has a plurality of surfaces, and rounded transition areas are formed between the surfaces.

For example, the trench gate structure may be used in a power device such as MOSFET or IGBT. Using the trench gate structure of the present embodiment may solve the problem of thinner thermal oxidation layer on the bottom of the trench gate structure effectively.

To sum up, the present invention provides a trench gate structure and a method of forming a trench gate structure. The method of forming a trench gate structure comprises steps of: providing a substrate, a crystal face of a surface of which belongs to a first family of crystal faces; forming a first trench on the surface of the substrate, a surface of a bottom of the first trench comprising a crystal face belonging to the first family of crystal faces, and a surface of a sidewall of the first trench comprising another crystal face belonging to a second family of crystal faces; forming an isolation layer on the surface of the sidewall of the first trench; performing face-selective wet etching on the surface of the bottom of the first trench and forming a second trench, a surface of the second trench comprising a crystal face belonging to a third family of crystal faces; a density of atom of the crystal face of the third family of crystal faces being higher than that of the crystal face of the first and second families of crystal faces; removing the isolation layer, and forming a thermal oxidation layer on the surface of the sidewall of the first trench and the surface of the second trench through a thermal oxidation process, a thickness of the thermal oxidation layer on the surface of the second trench is greater than that on the surface of the sidewall of the first trench. The trench gate structure comprises: a first trench and a second trench, formed on a substrate, the second trench being under the first trench; a thermal oxidation layer, formed on surfaces of the first trench and the second trench; a crystal face of a surface of the substrate belonging to a first family of crystal faces, a surface of a sidewall of the first trench comprising another crystal face of a second family of crystal faces, the surface of the second trench comprising yet another crystal face of a third family of crystal faces, a density of atom of the crystal face of the third family of crystal faces being higher than that of the first family of crystal faces and that of the second family of crystal faces, and a thickness of the thermal oxidation layer formed on the surface of the second trench being greater than that of the thermal oxidation layer formed on the surface of the sidewall of the first trench. The present invention introduces a new trench gate structure and method of forming a trench gate structure which applies face-selective wet etching to present a specific crystal face on the surface of the bottom of the trench and form a thicker gate oxide layer thereon than the gate oxide layer on the sidewall to avoid from failure due to thinner bottom gate oxide layer, increase breakdown voltage, and improve consistency of threshold voltage and reliability of the device.

It is to be understood that these embodiments are not meant as limitations of the invention but merely exemplary descriptions of the invention with regard to certain specific embodiments. Indeed, different adaptations may be apparent to those skilled in the art without departing from the scope of the annexed claims. In all instances, the scope of such claims shall be considered on their own merits in light of this disclosure, and such claims accordingly define the invention(s), and their equivalents or variations, that are protected thereby.

What is claimed is:

1. A method of forming a trench gate structure, comprising steps of:
   providing a substrate, a crystal face of a surface of which belongs to a first family of crystal faces;
   forming a first trench on the surface of the substrate, a surface of a bottom of the first trench comprising a crystal face belonging to the first family of crystal faces, and a surface a sidewall of the first trench comprising another crystal face belonging to a second family of crystal faces;
   forming an isolation layer on the surface of the sidewall of the first trench;
   performing face-selective wet etching on the surface of the bottom of the first trench and forming a second trench, a surface of the second trench comprising a crystal face belonging to a third family of crystal faces;
   a density of atom of the crystal face of the third family of crystal faces being higher than that of the crystal face of the first and second families of crystal faces;
   removing the isolation layer, and forming a thermal oxidation layer on the surface of the sidewall of the first trench and the surface of the second trench through a thermal oxidation process, a thickness of the thermal oxidation layer on the surface of the second trench is greater than that on the surface of the sidewall of the first trench.

2. The method of forming a trench gate structure according to claim 1, wherein the substrate comprises silicon substrate, the first family of crystal faces comprises {100} family, the second family of crystal faces comprises {110} family, and the third family of crystal faces comprises {111} family.

3. The method of forming a trench gate structure according to claim 1, wherein the wet etching is performed with solution of tetramethyl ammonium hydroxide or potassium hydroxide as etchant.

4. The method of forming a trench gate structure according to claim 1, wherein forming the first trench is performed with dry etching.

5. The method of forming a trench gate structure according to claim 1, wherein the surface of the bottom of the first trench is a recessed surface or a flat surface.

6. The method of forming a trench gate structure according to claim 1, wherein forming the isolation layer comprising steps of:
  depositing a layer of isolation material on the first trench and the surface of the substrate;
  performing anisotropic dry etching on the layer of isolation material to remove the layer of isolation material on the first trench and the surface of the substrate and forming the isolation layer on the surface of the sidewall of the first trench.

7. The method of forming a trench gate structure according to claim 1, wherein the second trench is a V-shaped trench.

8. The method of forming a trench gate structure according to claim 1, wherein the second trench has a plurality of surfaces, and rounded transition areas are formed between the surfaces and between the surfaces and the surface of the sidewall of the first trench after the thermal oxidation process.

9. A trench gate structure, comprising:
  a first trench and a second trench, formed on a substrate, the second trench being under the first trench;
  a thermal oxidation layer, formed on surfaces of the first trench and the second trench;
  a crystal face of a surface of the substrate belonging to a first family of crystal faces, a surface of a sidewall of the first trench comprising another crystal face of a second family of crystal faces, the surface of the second trench comprising yet another crystal face of a third family of crystal faces, a density of atom of the crystal face of the third family of crystal faces being higher than that of the first family of crystal faces and that of the second family of crystal faces, and a thickness of the thermal oxidation layer formed on the surface of the second trench being greater than that of the thermal oxidation layer formed on the surface of the sidewall of the first trench.

10. The trench gate structure according to claim 9, wherein the substrate comprises silicon substrate, the first family of crystal faces comprises {100} family, the second family of crystal faces comprises {110} family, and the third family of crystal faces comprises {111} family.

11. A power device comprising a trench gate structure according to claim 10.

12. The trench gate structure according to claim 9, wherein the second trench is a V-shaped trench.

13. A power device comprising a trench gate structure according to claim 12.

14. The trench gate structure according to claim 9, wherein the second trench has a plurality of surfaces, and rounded transition areas are formed between the surfaces.

15. A power device comprising a trench gate structure according to claim 14.

16. A power device comprising a trench gate structure according to claim 9.

* * * * *